United States Patent [19]
Nishida

[11] Patent Number: 6,014,043
[45] Date of Patent: *Jan. 11, 2000

[54] CURRENT SWITCHING TYPE SWITCH CIRCUIT

[75] Inventor: Yoshio Nishida, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/923,965

[22] Filed: Sep. 5, 1997

[30] Foreign Application Priority Data

Sep. 5, 1996 [JP] Japan .................................. 8-235419

[51] Int. Cl.[7] .................................................. H03K 5/22
[52] U.S. Cl. ................................ 327/65; 327/66; 327/53
[58] Field of Search ................................... 327/379, 560,
327/562, 563, 52, 53, 57, 65, 66, 374, 375;
330/252, 257

[56] References Cited

U.S. PATENT DOCUMENTS

| | | | |
|---|---|---|---|
| 4,523,105 | 6/1985 | Jose et al. | 327/65 |
| 4,871,933 | 10/1989 | Galbraith | 327/52 |
| 5,196,742 | 3/1993 | McDonald | 327/65 |
| 5,321,659 | 6/1994 | Taguchi | 365/207 |
| 5,361,040 | 11/1994 | Barrett, Jr. | 330/253 |
| 5,399,991 | 3/1995 | Moraveji | 330/255 |
| 5,414,392 | 5/1995 | Schupak | 332/118 |
| 5,473,567 | 12/1995 | McClure | 365/208 |
| 5,488,321 | 1/1996 | Johnson | 327/66 |
| 5,552,730 | 9/1996 | Deguchi | 327/103 |

FOREIGN PATENT DOCUMENTS

| | | |
|---|---|---|
| 60-41805 | 3/1985 | Japan . |
| 2-37829 | 2/1990 | Japan . |
| 5-78038 | 10/1993 | Japan . |

OTHER PUBLICATIONS

Takemoto et al., "A Fully Parallel 10–Bit A/D Converter with Video Speed", IEEE Journal of Solid State Circuit, vol. SC–17, No. 6, 1133–1138 (1982).

Matsuzawa et al, "An 8b 600 MHz Flash A/D Converter with Multistage Duplex Gray Coding", ICD91–86, 37–42.

*Primary Examiner*—Terry D. Cunningham
*Assistant Examiner*—An T. Luu
*Attorney, Agent, or Firm*—Foley & Lardner

[57] ABSTRACT

A current switching type switch circuit is constructed with a constant current source, a switch group consisted of a pair of P-type MOS transistors and a current mirror circuit consisted of first, second, third and fourth npn bipolar transistors. The sources of the P-type MOS transistors are connected in common and to a first power source via the constant current source. Complementary clock signals are input to the gates of the P-type MOS transistors. Collectors and bases of first and second npn bipolar transistors are respectively connected to drains of the P-type MOS transistors, and to bases of third and fourth npn bipolar transistors. Collectors of the third and fourth npn bipolar transistors are respectively connected to first and second load circuits. Also, emitters of all of npn bipolar transistors are connected to a second power source.

10 Claims, 7 Drawing Sheets

CURRENT SWITCHING TYPE SWITCH CIRCUIT

BACKGROUND OF THE INVENTION

1. Field of the Invention

The present invention relates generally to a current switching type switch circuit to be used for an analog/digital converter or so forth. More specifically, the invention relates to a current switching type switch circuit which can make an operation voltage of a current load circuit greater in a low power source voltage.

2. Description of the Prior Art

Conventionally, a current switching type switch circuit in a flip-flop and a sample hold circuit which are constructed by bipolar transistors has a pair of transistors controlled by a clock and a constant current source. Such switch circuit has been disclosed in Toyoki TAKEMOTO et al., "A Fully Parallel 10-Bit A/D Converter with Video Speed", IEEE JOURNAL OF SOLID STATE CIRCUIT, VOL. SC-17, No. 6, December 1982, pp. 1133–1138, and Akira MATSUZAWA et al., "An 8b 600 MHz Flash A/D Converter with Multistage Duplex Gray Coding", ICD91-86, pp. 37–42.

FIG. 1 is a circuit diagram showing the conventional current switching type switch circuit. As shown in FIG. 1, a first load circuit 5 and a second load circuit 6 are connected to a first power source 21 in parallel. These first and second load circuits 5 and 6 are connected to a current switching type switch circuit 54. The switch circuit 54 is constructed with npn bipolar transistors Q1 and Q2 and a constant current source 51. Namely, collectors of the transistors Q1 and Q2 are connected to the first and second load circuits 5 and 6, respectively. On the other hand, emitters of the npn bipolar transistors Q1 and Q2 are connected in common and to a second power source 22 via the constant current power 51. Furthermore, the bases of the bipolar transistors Q1 and Q2 are connected to clock signal input terminals 31 and 32, respectively.

In the switch circuit 54 constructed as set forth above, a non-inverted clock signal CLK2 and an inverted clock signal CLK2B having complementary relationship are input to the bipolar transistors from clock signal input terminals 31 and 32. Then, either one of the bipolar transistors Q1 and Q2 is turned ON and the other is turned OFF. By this, a current of the constant current source 51 flows through the first load circuit 5 or the second load circuit 6. Thus, the current of the constant current source 51 is supplied to different supply destination by switching the clock signal.

The conventional current switching type switch circuit shown in FIG. 1 has vertically stacked construction. The operation voltage Vd to be applied to the first and second load circuits 5 and 6 can be expressed by the following equation (1).

$$Vd = Vcc1 - Vcc2 - (Vce + VI) \quad (1)$$

In the equation (1), Vcc1 is a power source voltage of a first power source 21, and Vcc2 is a power source voltage of a second power source 22. Also, Vce is a voltage between collector and emitter of bipolar transistor, and VI is a voltage required for a constant current source 51. As expressed by the foregoing equation (1), when the power source voltage (Vcc1 − Vcc2) becomes lower, an operation voltage Vd to be applied to the load circuit also becomes lower. As a result, problems, such as lowering of operation frequency of the load circuit or narrowing of dynamic range are caused. Further detailed discussion will be given with respect to the problems.

FIG. 2 is a circuit diagram showing a comparator, to which the conventional current switching type switch circuit is applied, to be used in a high speed A/D converter or the like. FIG. 3 is a diagrammatic illustration showing an analog voltage to be input through a voltage input terminal. As shown in FIG. 2, the comparator is constructed with a constant current sources 52 and 53, bipolar transistors Q5, Q6, Q7, Q8, Q9 and Q10, resistors R1 and R2 and a switch circuit 54. Namely, collectors of the bipolar transistors Q5 and Q6 are connected to a first power source 21, bases thereof are respectively connected to voltage input terminals 33 and 34. Voltages of Vin1 and Vin2 are input to the input terminals 33 and 34, respectively. Also, emitters of the bipolar transistors Q5 and Q6 are connected to bases of the bipolar transistors Q8 and Q7, respectively, and in conjunction therewith, to the second power source 22 via constant current sources 52 and 53.

One end portions of the resistors R1 and R2 are connected to the first power source 21 in parallel. The other end of the resistor R1 is connected to a collector of the bipolar transistor Q7, a collector of the bipolar transistor Q9 and a base of the bipolar transistor Q10, and further to a voltage output terminal 35. On the other hand, the other end of the resistor R2 is connected to a collector of the bipolar transistor Q8, a base of the bipolar transistor Q9 and a collector of the bipolar transistor Q10, and further to a voltage output terminal 36.

Emitters of the bipolar transistors Q7 and Q8 are connected in common and to a collector of the bipolar transistor Q1 which forms the switch circuit 54. Emitters of the bipolar transistors Q9 and Q10 are connected in common and to a collector of the bipolar transistor Q2 which also forms the switch circuit 54.

In the comparator constructed as set forth above, when the clock signal CLK2 input through the clock signal input terminal 31 is HIGH, a current I flows through a differential amplifier formed by the bipolar transistors Q7 and Q8 and so forth. By this, fine input potential difference (Vin1−Vin2) is amplified. Subsequently, when the clock signal CLK2B input from the clock signal input terminal 32 turns HIGH, the input potential difference (Vin1−vin2) is amplified up to a digital level by a latch circuit formed by the bipolar transistors Q9 and Q10.

In FIG. 2, assuming that a base-emitter voltage of the bipolar transistor is Vbe, a lower limit Vmin of the input voltage is expressed by the following equation (2).

$$Vmin = 2Vbe + Vce + VI \quad (2)$$

On the other hand, assuming that a dynamic range of an analog voltage input is Vfc, and an upper limit of the input voltage is the power source voltage Vcc1, Vcc1 is expressed by the following equation (3).

$$Vcc1 = Vmin + Vfc \quad (3)$$
$$= 2Vbe + Vce + VI + Vfc$$

In the equations (2) and (3), Vbe, Vce and VI are expressed by the following expressions (4), (5) and (6).

$$Vbe \approx 0.8(V) \quad (4)$$

$$Vce \geq 0.5(V) \quad (5)$$

$$VI \geq 0.6(V) \quad (6)$$

Replacing the foregoing equation (2) with the expressions (4) to (6), the lower limit Vmin of the input voltage becomes greater than or equal to 2.7(V). Accordingly, when the power source voltage Vcc1 is 5.0(V), the dynamic range Vfc can be 2.3(V), whereas the power source voltage Vcc1 is 3.0(V), the dynamic range Vfc becomes 0.3(V).

FIG. 4 is a waveform chart showing waveforms of an input voltage, the clock signal and an output voltage corresponding thereto with taking voltage in vertical axis and time in horizontal axis. It should be noted that FIG. 4 shows waveforms in the case where the power source voltage Vcc1 is 3.0(V). As shown in FIG. 4, when the voltage input through the input terminal 33 is set at about 3.0(V), the dynamic range Vfc becomes 0.3(V), a digital voltage corresponding to the input voltage is output. However, when the input voltage is set about 2.5(V), it becomes impossible to output the normal digital level voltage.

SUMMARY OF THE INVENTION

It is an object of the present invention to provide a current switching type switch circuit which can make operation voltage of a current load circuit high, even when a power source voltage is low.

A current switching type switch circuit, according to the present invention, comprises a constant current source driven by a first potential, a switch group including first and second P-type MOS transistors and a current mirror circuit having first and second current input terminals and first and second current output terminals. A source of the first P-type MOS transistor and a source of the second P-type MOS transistor are connected to the constant current source in common. Gates of the first and second P-type MOS transistors are applied with complementary clock signals. The first and second current input terminals are connected to drains of the first and second P-type MOS transistors, respectively.

The current mirror circuit may include first, second, third and fourth npn transistors. In this case, collectors and bases of the first and second npn transistors are connected to drains of the first and second P-type MOS transistors via first and second current input terminals, respectively. Bases of the first and second npn transistors are connected to bases of the third and fourth npn transistors, respectively. Emitters of the first, second, third and fourth npn transistors are set at a second potential. Collectors of the third and fourth npn transistors are connected to the first and second current output terminals.

Areas of the emitters of the first and second npn transistors and areas of the emitters of the third and fourth npn transistors may be equal to each other or different from each other.

Collector-emitter voltages of the first, second, third and fourth npn transistors may be higher than or equal to 0.5 V.

In the alternative embodiment, the current mirror circuit may include first, second, third and fourth N-type MOS transistors. In this case, drain and gate of the first and second N-type MOS transistors are connected to drains of the first and second P-type MOS transistors via first and second current input terminals, respectively. Gates of the first and second N-type MOS transistors are connected to gates of the third and fourth N-type MOS transistors, respectively. Sources of the first, second, third and fourth N-type MOS transistors are set at a second potential. Drains of the third and fourth N-type MOS transistors are connected to the first and second current output terminals, respectively.

At this time, channel lengths of the first, second, third and fourth N-type MOS transistors are respectively assumed to be L1, L2, L3 and L4 and channel widths of the first, second, third and fourth N-type MOS transistors are respectively assumed to be W1, W2, W3 and W4, the ratios W1/L1 and W2/L2 and the ratios W3/L3 and W4/L4 may be equal to each other or different from each other.

In the present invention, the current mirror circuit is connected to the load circuit controlled by the switch circuit, and the constant current source and switch group controlled by clock are connected to the load circuit, in parallel. Current input to the current mirror circuit is controlled by operation of the switch group. Accordingly, even when the first potential is low, operation voltage of the load circuit becomes high.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 2 is a circuit diagram showing a comparator, to which the conventional current switching type switch circuit is applied, to be used in a high speed A/D converter or the like;

FIG. 3 is a diagrammatic illustration showing an analog voltage to be input through a voltage input terminal;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
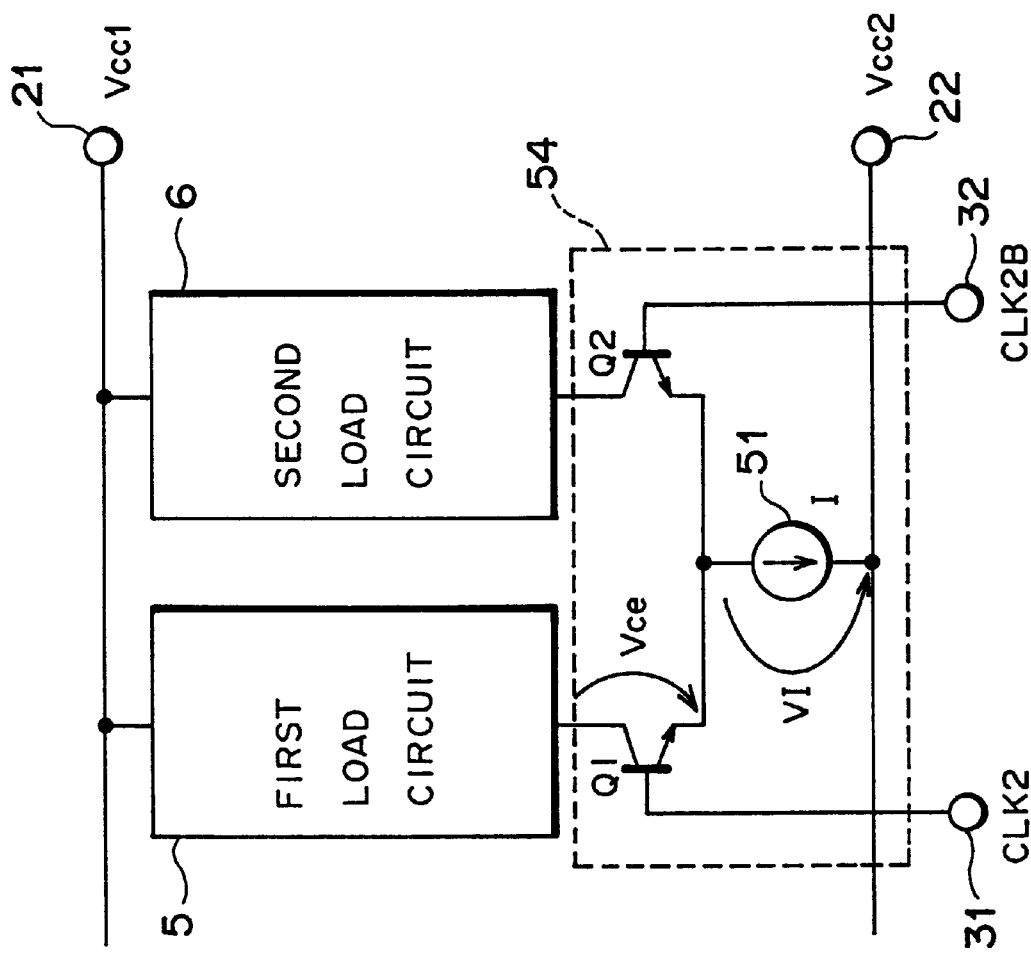
FIG. 1 is a circuit diagram showing the conventional current switching type switch circuit.
Figures 2, 3:
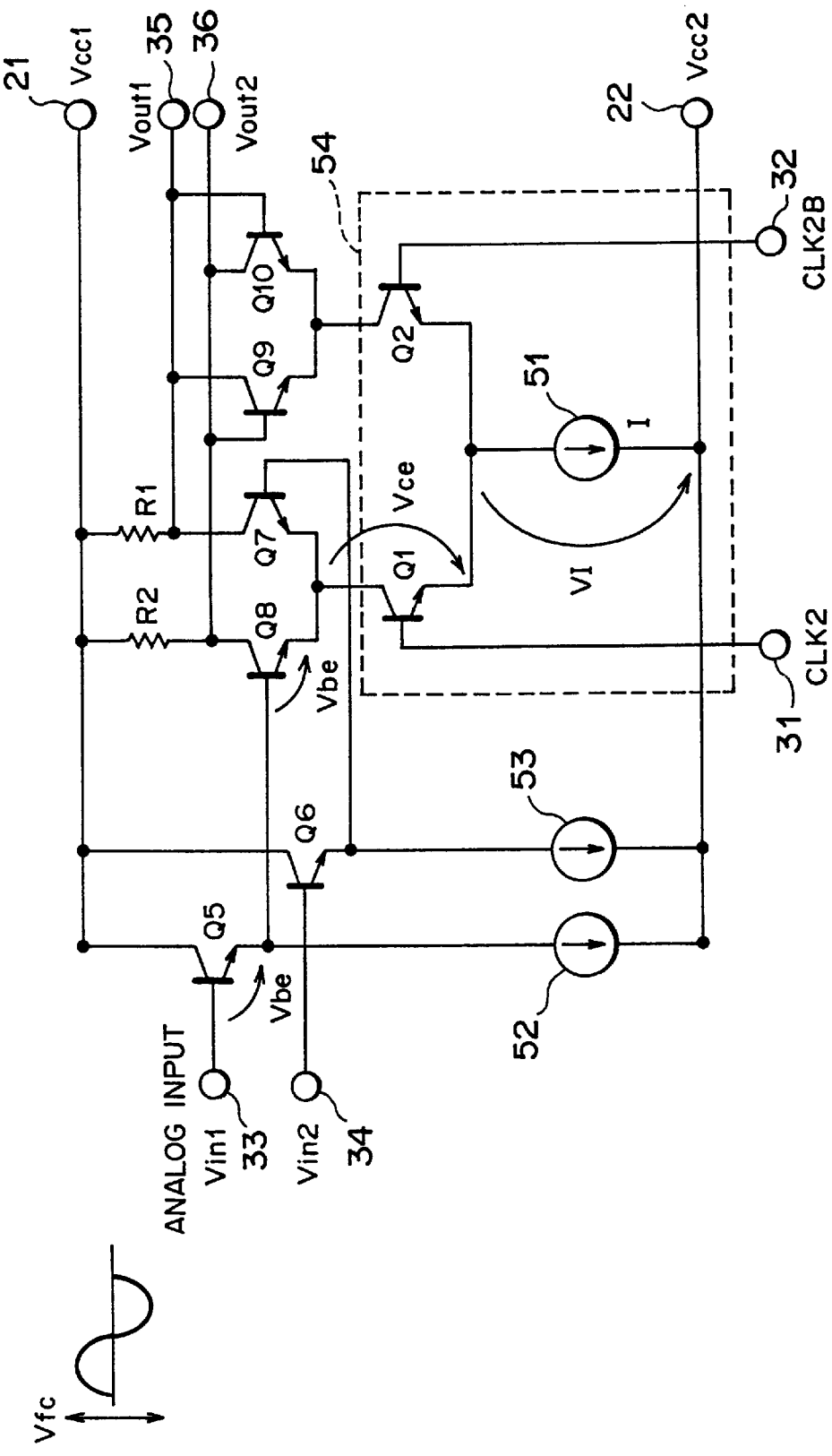
Figure 4:
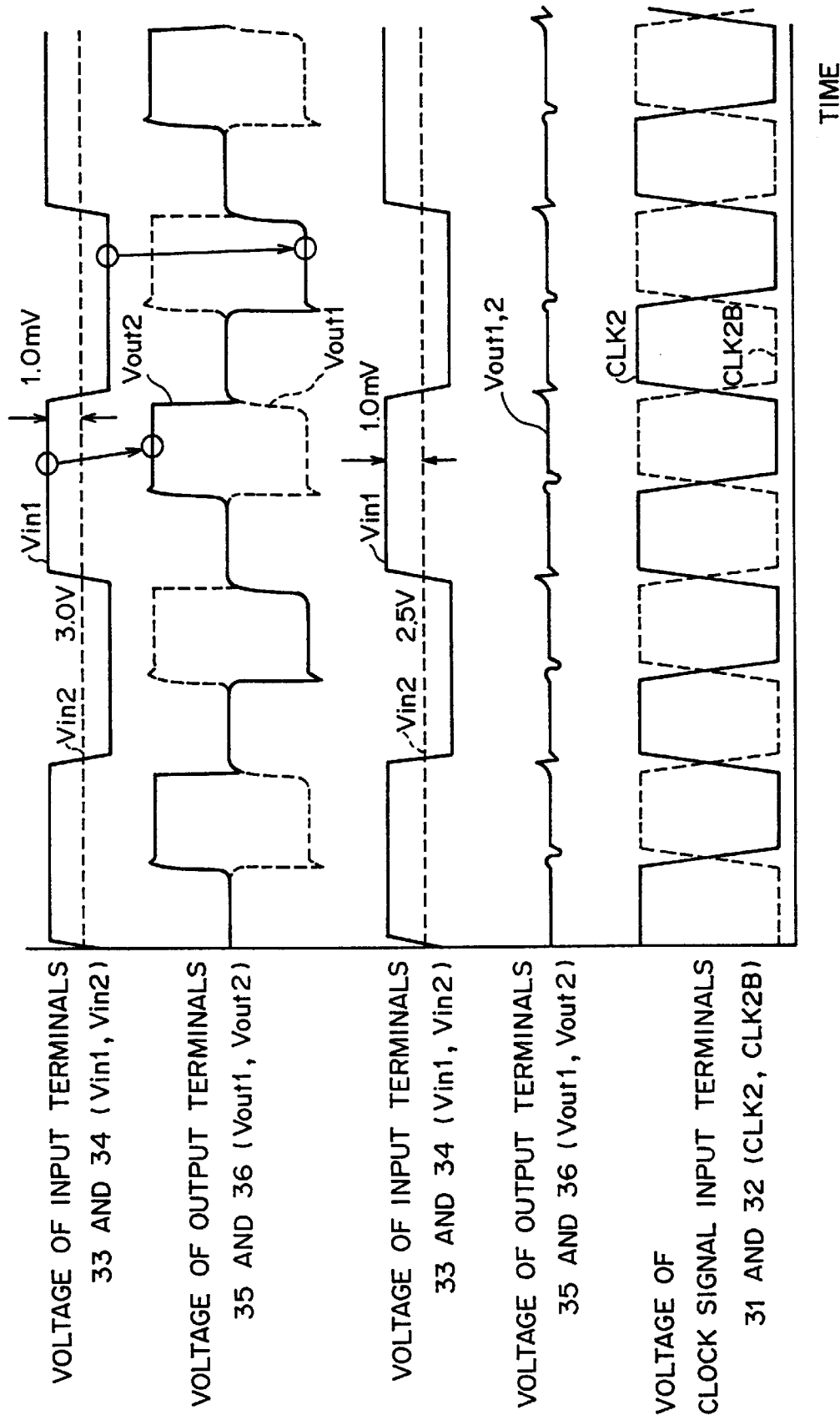
FIG. 4 is a waveform chart showing waveforms of an input voltage, the clock signal and an output voltage corresponding thereto with shown voltage shown in the vertical axis and time in the horizontal axis.
Figure 5:
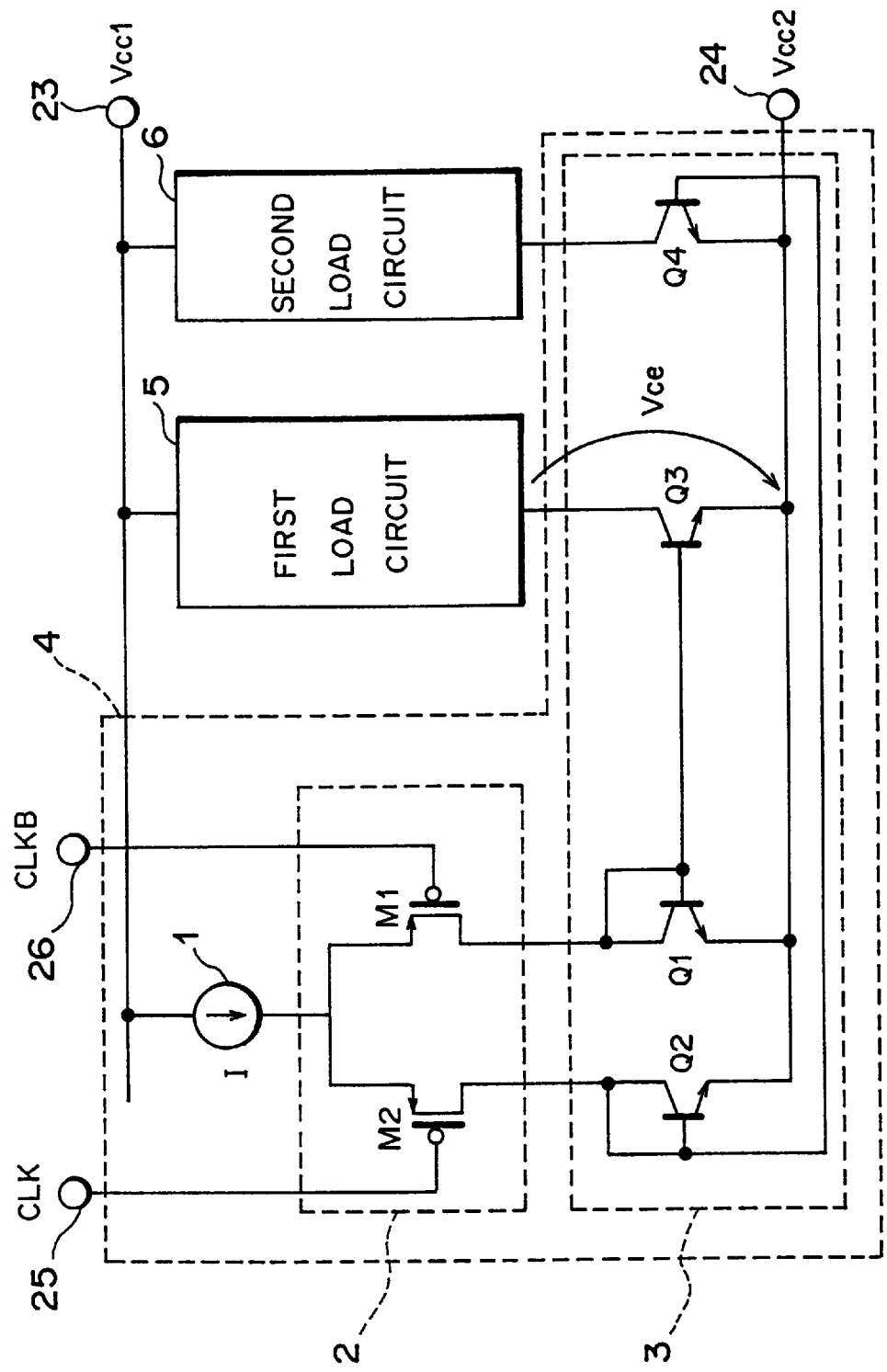
FIG. 5 is a circuit diagram showing the first embodiment of a current switching type switch circuit according to the present invention.

FIG. 5 is a circuit diagram showing the first embodiment of a current switching type switch circuit according to the present invention. As shown in FIG. 5, a first load circuit 5, a second load circuit 6 and a constant current source 1 of the current switching type switch circuit 4 are connected to a first power source 23, in parallel. The current switching type switch circuit 4 is constructed with a constant current source 1, a switch group 2 consisted of P-type MOS transistors M1 and M2 and a current mirror circuit 3 consisted of npn bipolar transistors Q1, Q2, Q3 and Q4. Namely, sources of the P-type MOS transistors M1 and M2 are connected in common and to a first power source 23 via a constant current source 1. On the other hand, clock signal input terminals 25 and 26 are connected to gates of the P-type MOS transistors M2 and M1, respectively. It should be noted that, in the first embodiment, area of npn bipolar transistor Q1 is equal to that of npn bipolar transistor Q3, and area of npn bipolar transistor Q2 is equal to that of npn bipolar transistor Q4.

Also, a collector and a base of the npn bipolar transistor Q1 are connected to a drain of the P-type MOS transistor M1, and to a base of the npn bipolar transistor Q3. Similarly, a collector and a base of the npn bipolar transistor Q2 are connected to a drain of P-type MOS transistor M2, and to a base of the npn bipolar transistor Q4. Thus, a pair of current mirror circuit 3 is constructed by the bipolar transistors Q1 and Q3 and bipolar transistors Q2 and Q4. Collectors of the npn bipolar transistors Q3 and Q4 are connected to the first and second load circuits 5 and 6, respectively. Also, emitters of the npn bipolar transistors Q1, Q2, Q3 and Q4 are connected in common and to a second power source 24.

In the switch circuit 4 constructed as set forth above, at first, a non-inverted clock signal CLK and an inverted clock signal CLKB in complementary relationship are input to the P-type MOS transistors through clock signal input terminals 25 and 26. Then, either one of the P-type MOS transistors M1 and M2 becomes ON and the other becomes OFF. For example, when the P-type MOS transistor M1 becomes ON, operation current I flows through the bipolar transistor Q1. Subsequently, the operation current I is supplied to the first load circuit 5 via the bipolar transistor Q3.

It should be noted that, by switching the clock signal, current I flows through the bipolar transistors Q2 and Q4 to supply the operation current I to the second load circuit 6.

In the meanwhile, in the current switching type switch circuit shown in FIG. 5, an operation voltage Vd to be applied to the first and second load circuits 5 and 6 are expressed by the following equation (7).

$$Vd = Vcc1 - Vcc2 - Vce \quad (7)$$

In the equation (7), Vcc1 is a power source voltage of the first power source 23, Vcc2 is a power source voltage of the second power source 24. On the other hand, Vce is a collector-emitter voltage of the bipolar transistor. As shown in the foregoing equations (1) and (7), the shown embodiment of the current switching type switch circuit has greater operation voltage Vd in comparison with that in the conventional current switching type switch circuit. Thus, a voltage required for the constant current source 1 can be made higher. As a result, in comparison with the conventional circuit, an operation frequency of the load circuit can be made greater or the dynamic range can be set greater.

Figure 6:
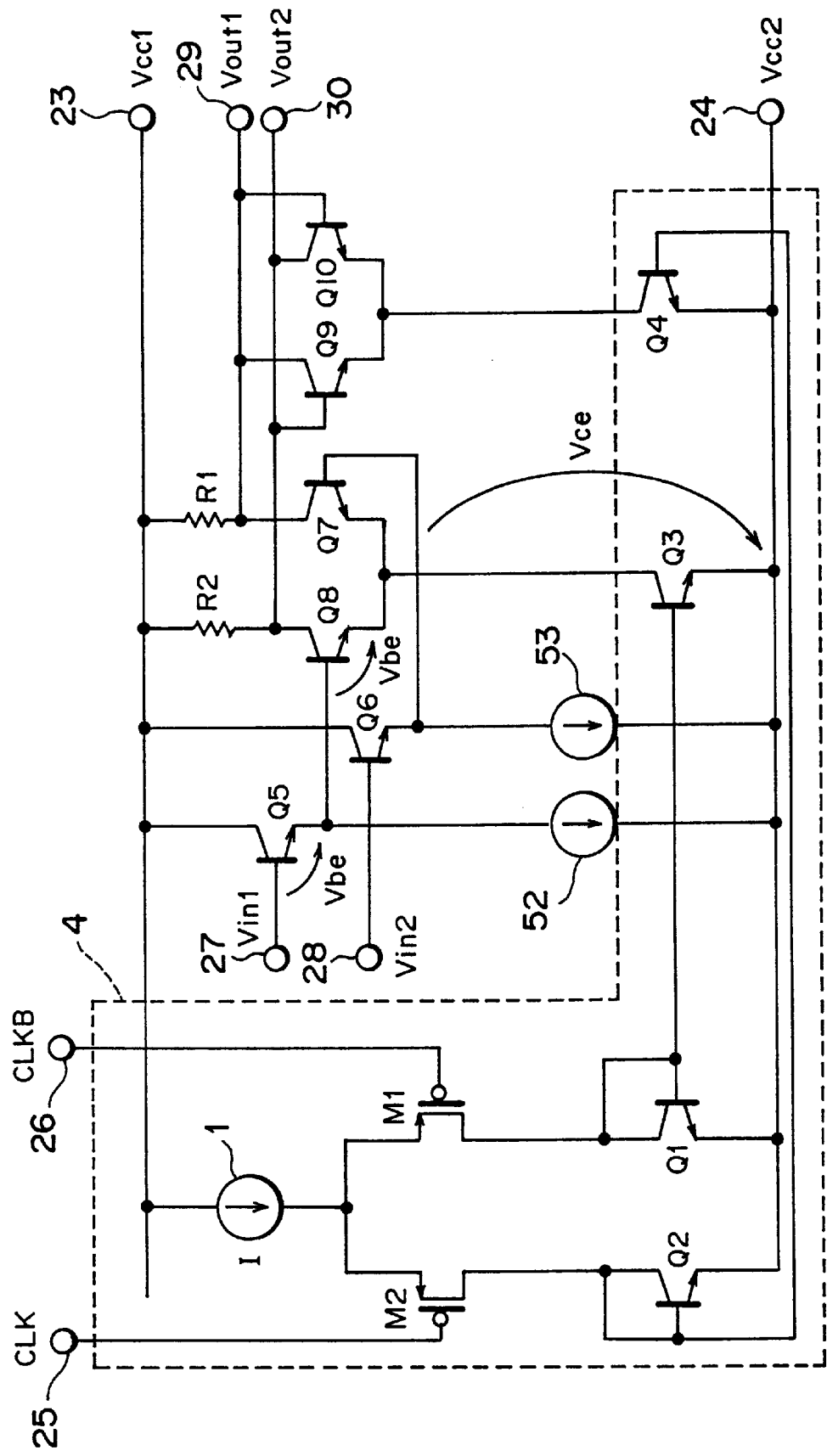
FIG. 6 is a circuit diagram showing a comparator, to which the first embodiment of the current switching type switch circuit is applied.

FIG. 6 is a circuit diagram showing a comparator, to which the first embodiment of the current switching type switch circuit is applied. As shown in FIG. 6, the comparator is constructed with the constant current sources 52 and 53, the bipolar transistors Q5, Q6, Q7, Q8, Q9 and Q10, resistors R1 and R2 and the current switching type switch circuit 4. Collectors of the bipolar transistors Q5 and Q6 are connected to the first power source 23, the bases thereof are connected to voltage input terminals 27 and 28, respectively. Voltages Vin1 and Vin2 are input to the voltage input terminals 27 and 28, respectively. On the other hand, emitters of the bipolar transistors Q5 and Q6 are connected to bases of bipolar transistors Q8 and Q7, and to the second power source 24 via the constant current sources 52 and 53, respectively.

One end portions of the resistors R1 and R2 are connected to the first power source 23 in parallel. The other end of the resistor R1 is connected to a collector of the bipolar transistor Q7, a collector of the bipolar transistor Q9 and a base of the bipolar transistor Q10, and further to a voltage output terminal 29. On the other hand, the other end of the resistor R2 is connected to a collector of the bipolar transistor Q8, a base of the bipolar transistor Q9 and a collector of the bipolar transistor Q10, and further to a voltage output terminal 30.

Emitters of the bipolar transistors Q7 and Q8 are connected in common and to a collector of the bipolar transistor Q3 which forms the current switching type switch circuit 4. Emitters of the bipolar transistors Q9 and Q10 are connected in common and to a collector of the bipolar transistor Q4 which also forms the current switching type switch circuit 4.

In the comparator constructed as set forth above, when the clock signal CLKB input from the clock signal input terminal 26 is LOW and the clock signal CLK input from the clock signal input terminal 25 is HIGH, the P-type MOS transistor M1 turns into ON. By this, a current I flows through the bipolar transistors Q1 and Q3 to be supplied to a differential amplifier formed by the bipolar transistors Q7 and Q8 and so forth. As a result, fine input potential difference (Vin1–Vin2) is amplified.

Subsequently, when the clock signal CLK input from the clock signal input terminal 25 turns LOW and the clock signal CLKB input from the clock signal input terminal 26 turns HIGH, the P-type MOS transistor M2 is turned ON. By this, current I flows through the bipolar transistors Q2 and Q4 to be supplied to a latch circuit consisted of the bipolar transistors Q9 and Q10. As a result, the input potential difference is amplified up to a digital level by the latch circuit.

In FIG. 6, a base-emitter voltage of the bipolar transistor is assumed as Vbe, the lower limit Vmin of the input voltage can be expressed by the following equation (8).

$$Vmin = 2Vbe + Vce \quad (8).$$

Here, replacing the equation (8) with the expressions (4) and (5), the lower limit Vmin of the input voltage becomes higher than or equal to 2.1(V). As expressed by the foregoing equations (3) and (8), in the comparator employing the conventional switch circuit, when the power source voltage Vcc1 is 3.0(V), dynamic range Vfc is 0.3(V). In contrast to this, in the comparator employing the shown embodiment of the switch circuit, even when the power source voltage Vcc1 is set at 3.0(V), 0.9(V) of dynamic range Vfc can be obtained.

Figure 7:
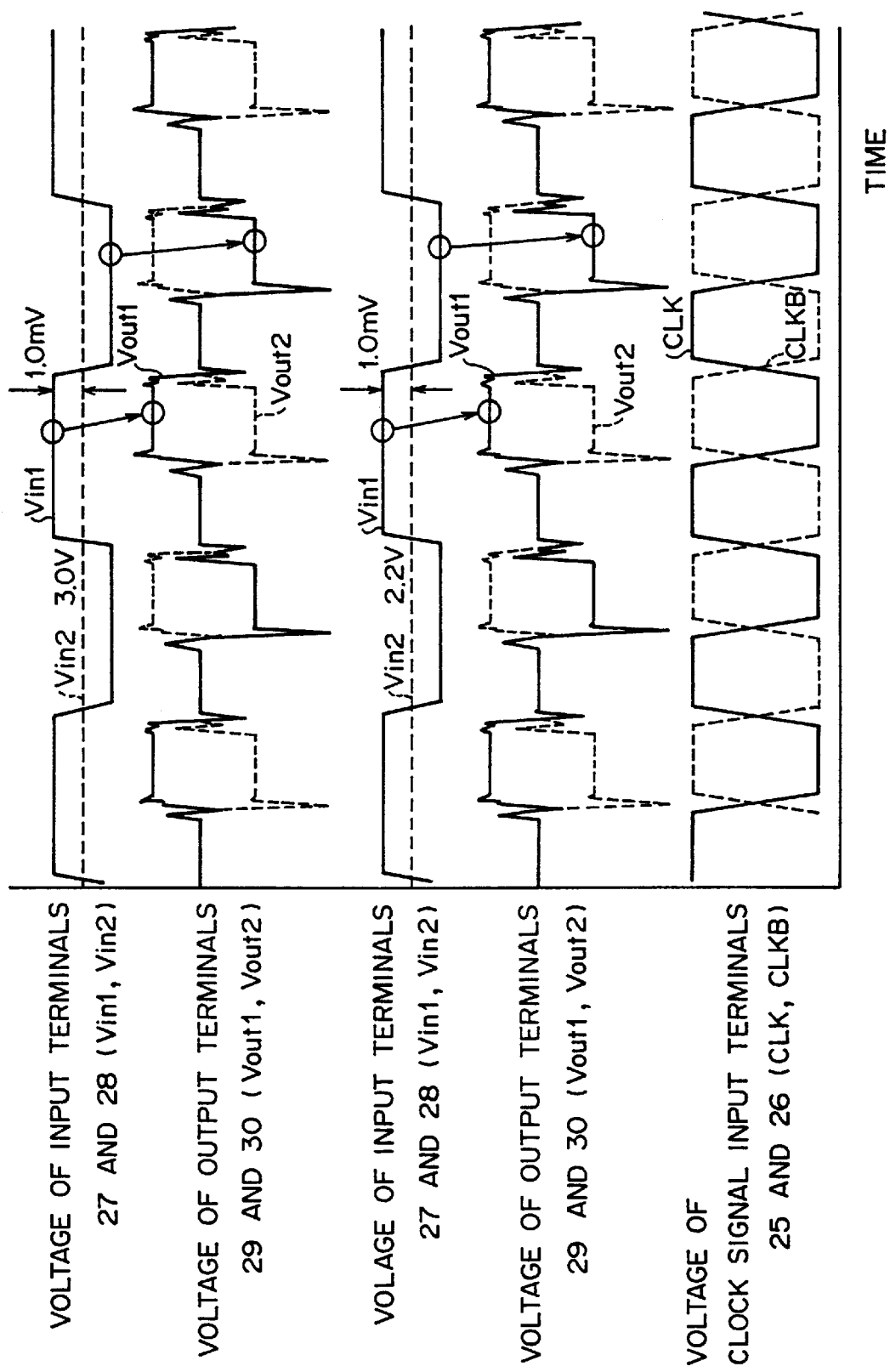
FIG. 7 is a waveform chart showing waveforms of an input voltage, the clock signal and an output voltage corresponding thereto with voltage shown in the vertical axis and time in the horizontal axis.

FIG. 7 is a waveform chart showing waveforms of an input voltage, the clock signal and an output voltage corresponding thereto with voltage shown in the vertical axis and time in the horizontal axis. It should be noted that, FIG. 7 shows waveforms in the case where the power source voltage Vcc1 is 3.0(V). As shown in FIG. 7, when the voltage input through the input terminal 27 is set at about 3.0(V), a digital voltage corresponding to the input voltage can be output through the output terminals 29 and 30. In the shown embodiment, even when the voltage input through the input terminal 27 is about 2.2(V), similarly to the case where the input voltage is about 3.0(V), a digital voltage corresponding to the input voltage can be output through the output terminals 29 and 30.

It should be noted that, in the shown embodiment, areas of npn bipolar transistors Q1 and Q2 are equal to areas of the npn bipolar transistors Q3 and Q4, respectively. However, even when areas of npn bipolar transistors Q1 and Q2 are different from areas of the npn bipolar transistors Q3 and Q4, respectively, the similar effect to the first embodiment can be achieved.

Also, in the first embodiment, the current mirror circuit 3 consisted of four npn bipolar transistors Q1, Q2, Q3 and Q4. However, the current mirror circuit may also be constructed with N type MOS transistors, for example.

Figure 8:
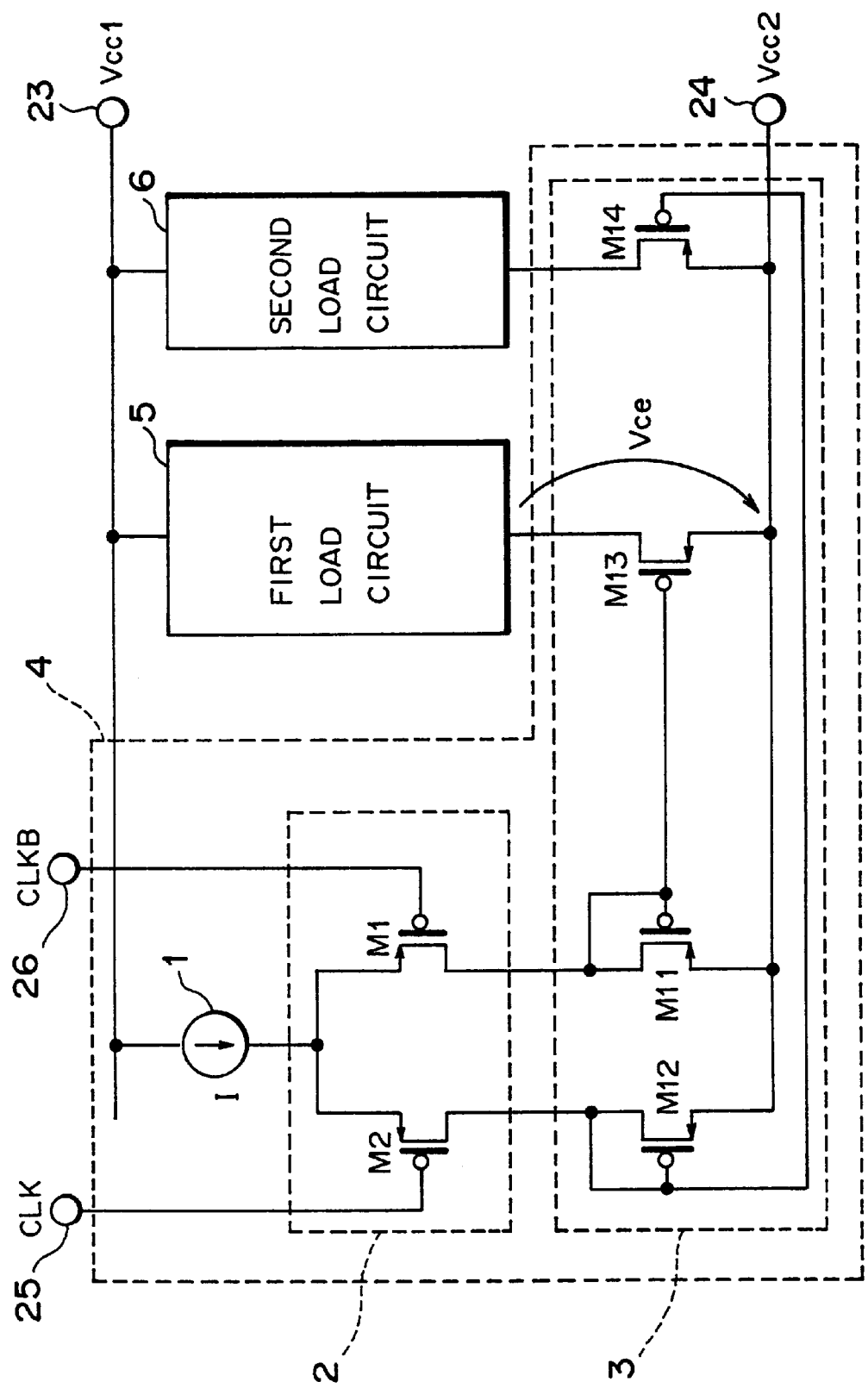
FIG. 8 is a circuit diagram showing the second embodiment of a current switching type switch circuit according to the present invention.

FIG. 8 is a circuit diagram showing the second embodiment of the current switching type switch circuit according to the present invention. The second embodiment of the switch circuit shown in FIG. 8 is differentiated from the first embodiment only in the transistors forming the current mirror circuit. Therefore, in FIG. 8, like elements to those in FIG. 5 will be identified by the same reference numerals and detailed discussion thereof is neglected.

As shown in FIG. 8, the current mirror circuit 3 is constructed with N-type MOS transistors M11, M12, M13 and M14. Namely, drains and gates of the N-type MOS transistors M11 and M12 in the current mirror circuit 3 are respectively connected to drains of the P-type MOS transistors M1 and M2 of the switch group 2. Also, gates of the N-type MOS transistors M11 and M12 are respectively connected to gates of the N-type MOS transistors M13 and M14. Furthermore, all sources of the N-type MOS transistors M11, M12, M13 and M14 are connected to second power source 24, and drains of the N-type MOS transistors M13 and M14 are connected to the first and second load circuits 5 and 6, respectively. In the second embodiment, when the channel lengths of the N-type MOS transistors M11, M12, M13 and M14 are L1, L2, L3 and L4, respectively, and the channel widths of these are W1, W2, W3 and W4, respectively, the ratio of channel width versus the channel length W1/L1 is equal to W3/L3. Also, the ratio of channel width versus the channel length W2/L2 is equal to W4/L4.

Even in the switch circuit constructed as set forth above, operation is similar to that of the first embodiment of the switch circuit. Accordingly, the similar effect to the first embodiment can be achieved.

It should be noted that, in the second embodiment, W1/L1 and W2/L2 are equal to W3/L3 and W4/L4, respectively. However, even when W1/L1 is different from W3/L3 and W2/L2 is different from W4/L4, the similar effect to the first and second embodiment can be achieved.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A current switching type switch circuit comprising:
    a current source connected between a first power source line and a first node;
    a first transistor connected between said first node and a second node, an non-inverting clock signal being supplied to a control terminal of said first transistor;
    a second transistor connected between said first node and a third node, an inverting clock signal being supplied to a control terminal or said second transistor;
    a third transistor being connected between said second node and a second power source line, a control terminal of said third transistor connected to said second nods;
    a fourth transistor connected between a third node and said second power source line, a control terminal of said fourth transistor being connected to said third node;
    a fifth transistor connected between said second power source line and a fourth node, a control terminal of said fifth transistor being connected to said second node, and a first load circuit being connected between said fourth node and said first power source line; and
    a sixth transistor connected between said second power source line and a fifth node, a control terminal of said sixth transistor being connected to said third node, a second load circuit being connected between said fifth node and said first power source line, said first and second load circuits being complimentarily driven in response to said non-inverting and inverting clock signals, respectively.

2. The current switching type switch circuit as recited in claim 1, wherein
    said first and second transistors are P-channel MOS transistors, and
    said third, fourth, fifth and sixth transistors are npn transistors,
        collectors and bases of said third and forth transistors being connected to drains of said first and second transistors via said second and third nodes, respectively,
        bases of said third and forth transistors being connected to bases of said fifth and sixth transistors respectively,
        emitters of said third, forth, fifth and sixth transistors being connected to said second power source line, and
        collectors of said fifth and sixth transistors being connected to said forth and fifth nodes.

3. The current switching type switch circuit as set forth in claim 2, wherein
    the area of said emitter of said third transistor is equal to the area of said emitter of said fifth transistor, and
    the area of said emitter of said forth transistor is equal to the area of said emitter of said sixth transistor.

4. The current switching type switch circuit as set forth in claim 2, wherein
    the area of said emitter of said third transistor is different from the area of said emitter of said fifth transistor, and
    the area of said emitter of said fourth transistor is different from the area of said emitter of said sixth transistor.

5. The current switching type switch circuit as set forth in claim 2, wherein collector-emitter voltages of said third, fourth, fifth and sixth transistors are greater than or equal to 0.5 v.

6. The current switching type switch circuit as set forth in claim 1, wherein
    said first and second transistors are P-channel MOS transistors, and
    said third, fourth, fifth and sixth transistors are N-channel MOS transistors,
        drains and gates of said third and forth transistors being connected to drains of said first and second transistors via said second and third nodes, respectively,
        gates of said third and fourth transistors being connected to gates of said fifth and sixth transistors, respectively,
        sources of said third, fourth, fifth and sixth transistors being connected to said second power source line, and
        drains of said fifth and sixth transistors being connected to said fourth and fifth nodes.

7. The current switching type switch circuit as set forth in claim 4, wherein the channel lengths of said third, fourth, fifth and sixth transistors are respectively defined as L1, L2, L3 and L4 and channel widths of said third, fourth, fifth and sixth transistors are respectively defined as W1, W2, W3 and W4, and wherein the ratio W1/L1 is equal to the ratio W3/L3, and the ratio W2/L2 is equal to the ratio W4/L4.

8. The current switching type switch circuit as set forth in claim 4, wherein the channel lengths of said third, fourth, fifth and sixth transistors are respectively defined as L1, L2, L3 and L4 and channel widths of said third, fourth, fifth and sixth transistors are respectively defined as W1, W2, W3 and W4, and wherein the ratio W1/L1 is different from the ratio W3/L3, and the ratio W2/L2 is different from the ratio W4/L4.

9. The current switching type switch circuit as set forth in claim 1, wherein a potential of said second power source line is different from a ground potential.

10. The current switching type switch circuit as set forth in claim 1, wherein a potential of said second power source line is different from a ground potential.

* * * * *